US008095584B2

(12) United States Patent
Barnett et al.

(10) Patent No.: US 8,095,584 B2
(45) Date of Patent: Jan. 10, 2012

(54) RANDOM NUMBER GENERATOR USING JITTER SAMPLED RF CARRIER

(75) Inventors: Raymond E. Barnett, Dallas, TX (US); Ganesh Kumar Balachandran, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1297 days.

(21) Appl. No.: 11/265,261

(22) Filed: Nov. 2, 2005

(65) Prior Publication Data

US 2007/0100921 A1 May 3, 2007

(51) Int. Cl.
*G06F 7/58* (2006.01)
*G08C 19/12* (2006.01)

(52) U.S. Cl. ...... 708/250; 708/251; 708/255; 340/13.26

(58) Field of Classification Search .................. 708/250, 708/255; 340/13.26
See application file for complete search history.

(56) References Cited

U.S. PATENT DOCUMENTS

| | | | | |
|---|---|---|---|---|
| 6,795,496 B1 * | 9/2004 | Soma et al. | 375/226 |
| 6,861,888 B2 * | 3/2005 | Hsieh | 327/208 |
| 2002/0063622 A1 | 5/2002 | Bell et al. | |
| 2002/0175805 A9 | 11/2002 | Armstrong et al. | |
| 2003/0093455 A1 * | 5/2003 | Messina et al. | 708/801 |
| 2003/0179078 A1 * | 9/2003 | Chen et al. | 340/10.2 |
| 2006/0224647 A1 * | 10/2006 | Gutnik | 708/250 |
| 2007/0180009 A1 * | 8/2007 | Gutnik | 708/250 |

OTHER PUBLICATIONS

Bucci et al, A high-speed oscillator-based truly random number source for cryptographic applications on a smart card IC, Apr. 2003, IEEE Transactions on Computers, p. 403-409.*
Mansuri et al, A low-power low-jitter adaptive-bandwidth PLL and clock buffer, 2003, Solid-State Circuits Conference, 2003. Digest of Technical Papers. ISSCC. 2003 IEEE International, vol. 1, p. 430-505.*
Bagini e al, A Design of Reliable True Random Number Generator for Cryptographic Applications, copyright 1999, Cryptographic Hardware and Embedded Systems, vol. 1717/1999.*
Petrie et al, A noise-based IC random number generator for applications incryptography, May 2000, IEEE Transactions on Circuits and Systems I: Fundamental Theory and Applications, p. 615-621.*
Finkenzeller (RFID Handbook: Fundamentals and Applications in Contact less Smart Cards and Identification, 2003, John Wiley & Sons, Ltd).*
"Fully Integrated Passive UHF RFID Transponder IC With 16.7-W Minimum RF Input Power,"IEEE Journal of Solid-State Circuits, vol. 38, No. 10, Oct. 2003, pp. 1602-1608 (Karthaus, et al.).

* cited by examiner

*Primary Examiner* — Li Zhen
*Assistant Examiner* — Hang Pan
(74) *Attorney, Agent, or Firm* — William B. Kempler; Wade J. Brady, III; Frederick J. Telecky, Jr.

(57) ABSTRACT

A random number generator generates a string of random bits from a received RF signal source. A sample-and-hold circuit is coupled to the received RF signal source. The RF signal is sampled by a jittered clock signal from a source coupled to the sample-and-hold circuit. The frequency of the jittered clock signal is less than frequency of the received RF signal. The random number appears at the output of the sample-and-hold circuit.

11 Claims, 5 Drawing Sheets

RANDOM NUMBER GENERATOR USING JITTER SAMPLED RF CARRIER

TECHNICAL FIELD

This application relates to a random number generator and more specifically to a random number generator which uses a jitter sampled RF carrier which is particularly useful for an RFID circuit.

BACKGROUND

Radio Frequency Identification (RFID) Systems utilize "tags" which are attached to an object to be tracked and have been used in automated pay systems, and the tracking of animals or goods in inventory or in transit. These devices have been around since the 1970's but are burgeoning in the market because of the need for a system which tracks goods which does not need the direct contact that is required for a bar code reader, for example. Currently major retailers are planning on implementing the use of RFID tags on pallets in order to track inventory and plan to start using these on individual items, once the cost of the tags is reduced to about 5 cents per tag.

RFID tags identify themselves to an interrogating radio frequency signal by transmitting back a digitally stored identification number or by generating a random number as the identification number. Considering the large volume of such tags that will be available, the utilization of a limited number of digital bits for storing the identification code could mean that there will be a collision between two devices, each claiming the same code. In this case, the random number generator would be activated to generate different random numbers from the two tags so that they could each be individually identified. Another possibility is the use of the random number generator to generate the unique code directly instead of using a stored identification code.

The major problem in generating a random number is the amount of power that such circuits consume. RFID tags obtain their power by rectifying the received radio frequency interrogation signal, and charging a capacitor to this voltage. Therefore, only an ultra-low power technique can be utilized. Two basic methods are known to generate true random numbers. The first amplifies thermal noise and the second samples a high frequency oscillator with a jittered clock. Both of these methods, however, consume more power than is suitable for an RFID application. A technique known from the "IEEE Transactions on Computers", April 2003, is the utilization of a high frequency oscillator 102 input to a D-flip flop 106 and using a clock which is a jittered low frequency oscillator 104. If the standard deviation of the jitter is greater than their high frequency oscillator period, then a random bit stream is output. This is illustrated in FIG. 1. The high frequency oscillator used in the published article is a 10-stage 1 GHz ring oscillator which has a large current consumption is therefore unsuitable for use in an RFID tag. Utilizing the prior art technique based upon amplifying thermal noise requires the noise level to be increased to a value larger than the offset voltages due to device mismatches. This, in turn, requires a wide band noise source and a wide band amplifier, both of which consume significant amounts of power.

Accordingly, there is a need for a circuit to produce a true random number bit stream that consumes very small amounts of power.

SUMMARY OF THE INVENTION

It is a general object of the present invention to provide a true random number generator for an RFID circuit.

This and other objects and features are attained, in accordance with a first aspect of the present invention, by a random number generator comprising a received RF signal source. A sample-and-hold circuit is coupled to the RF signal source. A jittered clock signal source is coupled to the sample-and-hold circuit, frequency of the jittered clock signal being less than frequency of the received RF signal.

A second aspect of the invention includes a RFID TAG comprising: a receiver for receiving an RF signal. A system clock generates a clock signal having a frequency that is less than frequency of the RF signal. A noise buffer is coupled to the system clock for adding jitter to the clock signal to generate a jittered clock signal. A sample-and-hold circuit is coupled to the receiver and the noise buffer for sampling the RF signal with the jittered clock.

DETAILED DESCRIPTION OF ILLUSTRATIVE EMBODIMENTS

Figure 1:
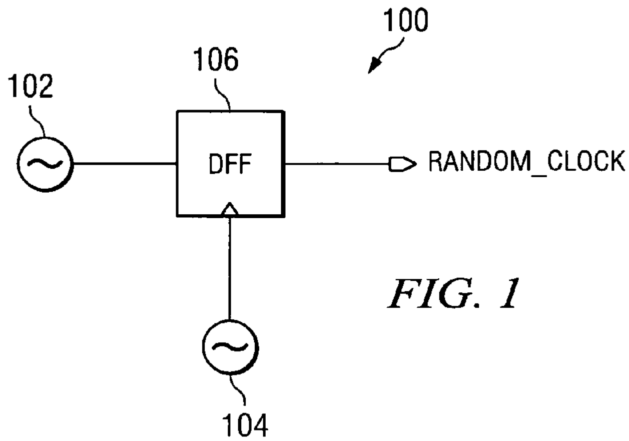
FIG. 1 is a block diagram of a prior art technique for generating a random number.
Figure 2:
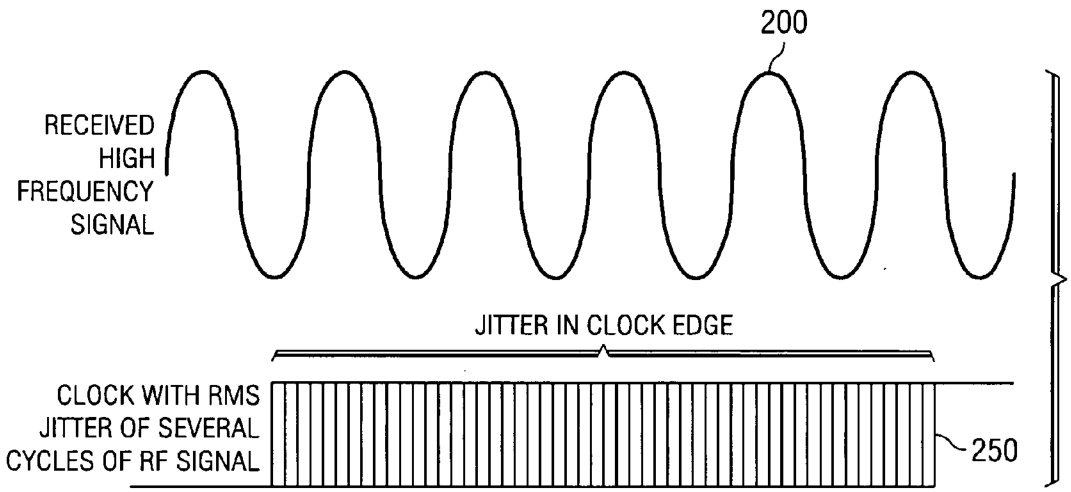
FIG. 2 illustrates the principal of the present invention.

FIG. 2 illustrates the principal of the present invention. In FIG. 2 a high frequency signal, here a RF signal 200 transmitted from an interrogating transmitter towards the RFID tag may have a frequency, for example, of 1 GHz. The signal is sampled by a clock which contains a RMS jitter of several cycles of the RS cycle. The sampling clock is at a frequency that is much lower than that of the RF signal, for example, 1 MHz. The jitter in the clock as illustrated by reference numeral 250 shows the possible sampling points created by jittering the low frequency clock signal. That is, all of these sample points illustrated are not generated at any given time, but any one of them can be utilized to perform the sampling, to generate a true random number sequence. Due of the fact that the RFID tags receive the RF signal as both in interrogating signal and a power supply signal source, this same signal can be utilized to replace the oscillator in prior art circuits, which dramatically reduces the current consumption for the random number generator.

Figure 3:
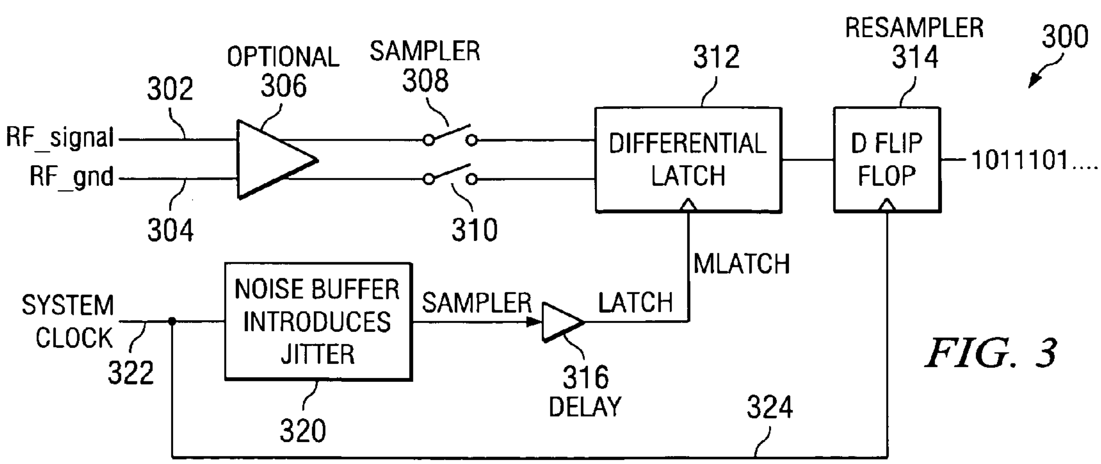
FIG. 3 is a schematic block diagram of a circuit to implement the present invention.

A circuit for performing the random number generation, based upon the principles of the present invention is shown in FIG. 3 generally as 300. A differential RF signal is received at input terminals, 302, 304, and may pass through optional amplifier 306. In many cases, the RF signal will be an input level which is several hundred millivolts, so that no amplifier is needed. The signal passes through sampling switches 308, 310 into differential latch 312. The differential latch is clocked by a signal NLATCH which is generated by taking the system clock for the RFID tag 322 and passing it through a noisy buffer circuit 320, which introduces jitter to the signal.

The output of the noisy buffer 320 is signal SAMP which passes through a delay 316 to generate the signal NLATCH. The output of the differential latch 312 is a random number sequence as will be explained hereinbelow. In order to resynchronize the signal stream with the system clock, the output of the differential latch 312 can be passed to a resampler D flip-flop 314 which is clocked by the system clock via line 324 so that the output is synchronous with the system clock.

Figure 4:
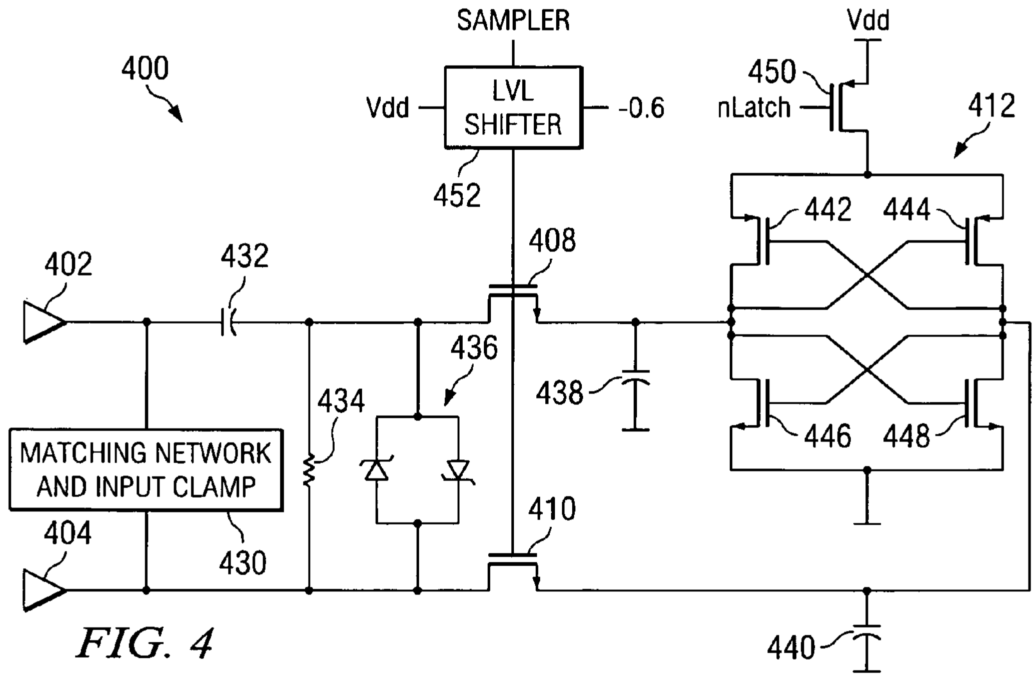
FIG. 4 is a schematic diagram of the sampler and differential latch shown in FIG. 3.

FIG. 4 is a schematic diagram of the sampling switches 308, 310, and differential latch 312, shown in FIG. 3, here generally illustrated as 400. In this embodiment, the optional RF amplifier 306 has been omitted. The RF signal from the antenna is applied directly to terminals 402, 404. An input matching circuit 430 is coupled between terminals 402 and 404. A pair of back to back Schottky diodes 436 are placed across the terminals in order to limit the signal to plus or minus 300 millivolts to ensure that the signal swing is kept to a level which does not introduce non-linear affects, but at the same time is large enough to overcome device offsets. This is a very important consideration in the generation of a random binary sequence to ensure that the probability of generating a one (1) bit is the same as generating a zero (0) bit. If the clamp were to be omitted, the switch resistance would be higher for positive signals than for negative signals which would result in a signal at node C with a duty cycle of less than fifty (50%) percent. This will cause more zero (0) bits in the bit stream than one (1) bits. In order that the Schottky pair do not load the input matching circuit, an impedance is introduced between the input and the Schottky pair. The value of this impedance at the frequency of interest should be greater than the resonant resistance of the input matching circuit. For example, the source and the integrated circuit, they both have impedances of 700 Ω. Therefore, the affect of the resistance at the input would be 350 Ω. The 80 fF capacitor provides an impedance of 2 kΩ at 1 GHz thereby effectively decoupling the input matching input network from the Schottky diodes. A resistance of 2 kΩ would serve the same purpose. Resistor 434 has one terminal connected between the capacitor 432 and the Schottky diodes 436 and the other terminal connected to terminal 404. Capacitor 432 and resistor 434 provide the AC coupling of the signal into the sample and hold circuit.

A switching NMOS transistor 408 is placed in series with the 402, to sample the signal and store the value in capacitor 438. A second NMOS transistor 410 is placed in series with the input 404 to store charge in capacitor 440. The gates of transistors 408, 410 are connected to a level shifter 452 which responds to the signal SAMP generated by the noise buffer 320, as shown in FIG. 3. When the differential samples have been taken, the signal NLATCH, which is a delayed version of the signal SAMP, is applied to the gate of PMOS transistor 450 having its source connected to VDD and its drain connected to the sources of PMOS transistors 442, 444 which are cross-coupled so that the gate of transistor 442 is connected to the drain of transistor 444 and the gate of transistor 444 is connected to the drain of transistor 442. The drain of transistor 442 is also connected to the drain of NMOS transistor 446 and the drain of transistor 444 is connected to the drain of NMOS transistor 448. The gate of transistor 446 is connected to the drain of transistor 448 and the gate of transistor 448 is connected to the drain of transistor 446. The sources of transistors 446 and 448 are connected to ground. Transistor 408, 410 are used to sample the signal applied to terminals 402, 404 using the jittered clock signal SAMP via level shifter 452 to store values in capacitors 438, 440. This sampled value is then latched into latch 412 comprising transistors 442, 444, 446, 448 and 450 utilizing the signal NLATCH, which is the delayed version of the circuit SAMP via delay circuit 316 shown in FIG. 3. The output of the latch circuit will be a one (1) or a zero (0), depending on the value of the input RF signal that was captured.

The sampling switch 408, 410 should have an off state gate voltage less than zero (0) volts in order that the negative going signal at node A not turn the switch on. If the switch turns on due to such a negative going signal, the charge stored at node C during the hold phase, will leak to node A. The offset voltage of the latches is of concern only when resolving small signals. The input drives the NMOS transistors, and, for small signals, at the moment the signal NLATCH goes low, which causes the latch to latch to data, it is the PMOS devices 442, 444 which have very large currents, because $V_G$~O due to the small input signal and $V_S$~$V_{DD}$, and determine the latches final values. Therefore, it is only the PMOS devices 442, 444 offset which matters and not those of NMOS devices 446, 448. This allows the NMOS devices to be chosen to be small, to reduce the power consumption of the circuit.

Figure 5:
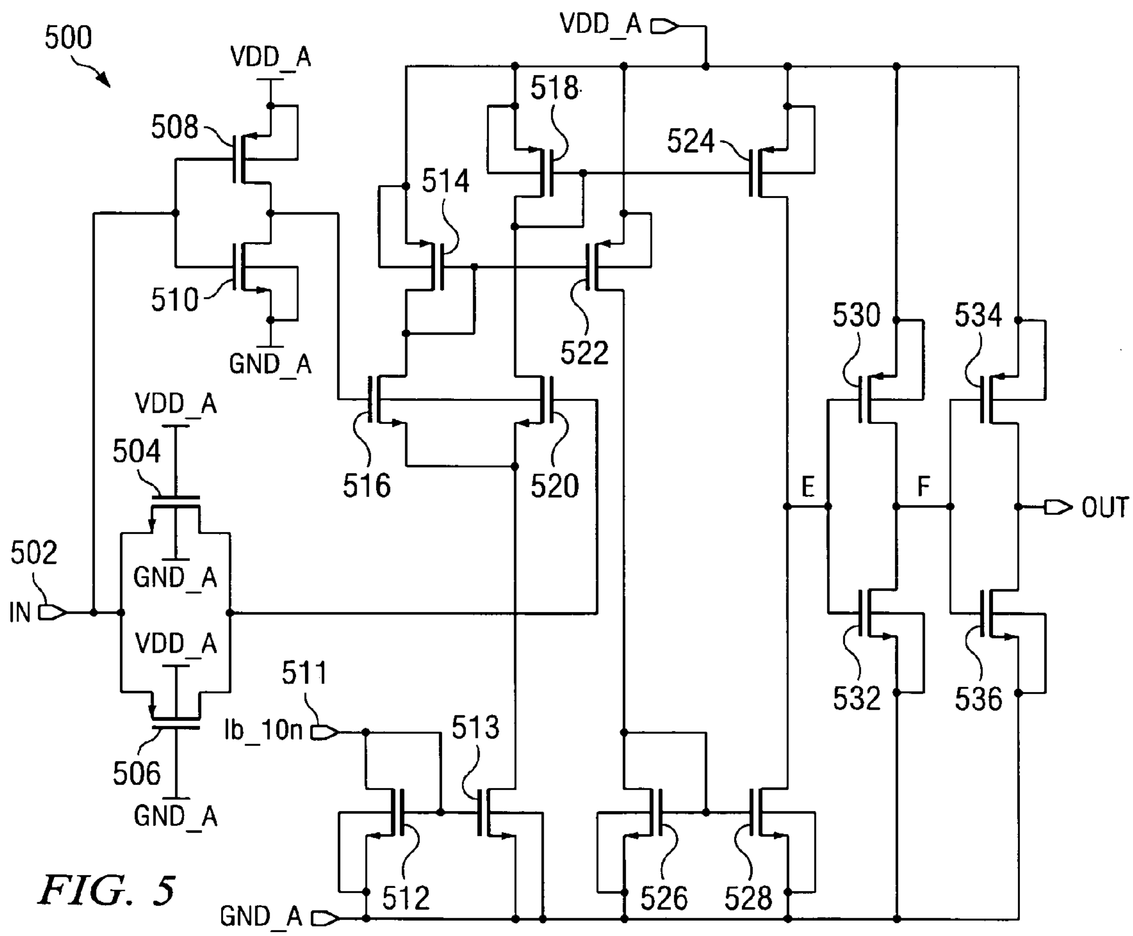
FIG. 5 is a schematic diagram of the noise buffer shown in FIG. 3.

FIG. 5 shows a schematic diagram of a noisy buffer, such as noise buffer 320 of FIG. 3, suitable for use with the present invention generally as 500. At FIG. 5 the system clock is input on terminal 502 and coupled simultaneously to the sources of NMOS transistors 504, 506, the gate of PMOS transistor 508 and the gate of NMOS transistor 510. The gate of transistor 504 is coupled to VDD and the gate of transistor 506 is coupled to ground. The source of transistor 508 is coupled to VDD and the drain is coupled to the drain of transistor 510 the source of which is coupled to ground. The sources of transistors 504, 506 are connected together and to the gate of NMOS transistor 520. The connected drains of transistors 508, 510 are connected to the gate of NMOS transistor 516. The sources of transistors 516 and 520 are connected together. The drain of transistor 516 is connected to the drain of PMOS transistor 514 which is diode-connected. The drain of transistor 520 is connected to the drain of transistor 518 which is diode-connected. The gate of transistor 514 is connected to the gate of PMOS transistor 522 and the gate of transistor 518 is connected to the gate of PMOS transistor 524, the sources of which are both connected VDD. The drain of transistor 522 is connected to the drain of NMOS transistor 526, which is diode-connected and has its source connected to ground. The drain of transistor 524 is connected to the drain of NMOS transistor 528 and the source is connected to ground. The gate of transistor 528 is connected to the gate of transistor 526. A bias current is applied to terminal 511 which is connected to the drain of NMOS transistor 512, which is diode-connected and has its source connected to ground. The gate of transistor 512 is connected to the gate of NMOS transistor 513 which has its source connected to ground and its drain connected to the interconnected sources of transistors 516 and 520. The drain of transistor 528 is connected to the gates of PMOS transistor 530 and NMOS transistor 532. The source of transistor 530 is connected to VDD and the source of transistor 532 is connected to ground. The interconnected drains of transistors 530 and 532 are connected to the interconnected gates of transistor 534 and NMOS transistor 536. The source of PMOS transistor 534 is connected to VDD and the source of NMOS transistor 536 is connected to ground. The drains of transistors 534 and 536 are interconnected and comprise the output of the circuit.

Figure 6:
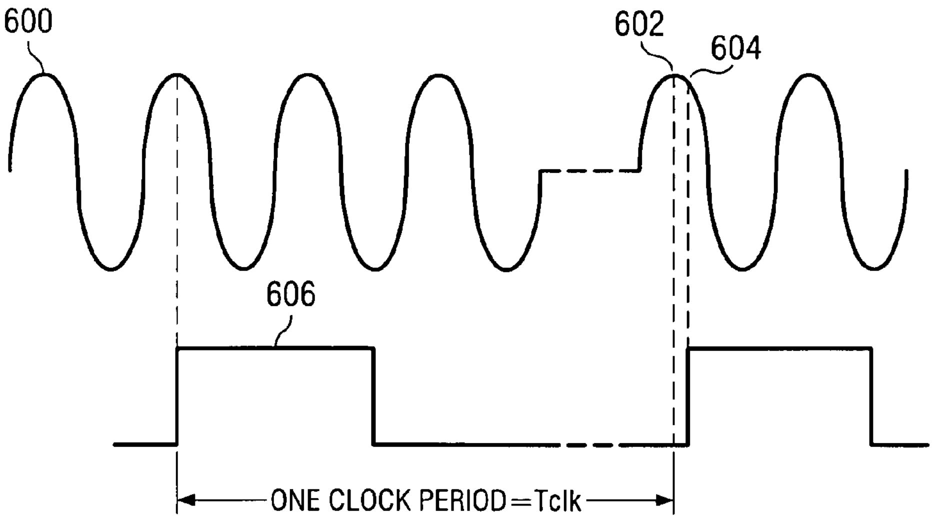
FIG. 6 illustrates the phase noise requirement for a true random number sequence.

The RMS jitter of the noisy clock needs to be several times the RF time period, for example, at least six (6) times. This will ensure that the probability of obtaining a digital "1" and a digital "0" are the same. For example, if we choose a system having a system clock frequency of 1 MHz and a RF signal having a frequency of 1 GHz, without added noise, the RF signal sample by the 1 MHz clock will yield the string of either digital ones or digital zeros. If the 1 MHz clock has a lot of phase noise, but the phase noise components lie below 1 MHz, then the edge of the 1 MHz clock changes its position slowly, as seen in FIG. 6, the RF signal 600 would be sampled at point 602 by clock signal 606 if there is no phase noise, but is sampled at point 604 if there is low frequency phase noise present. This causes the output pattern to be as follows: 11100111000, where there are consecutive ones and zeros. This gives preference to some numbers over others, thus decreasing the randomness of the output string which constitutes the random number. The conclusion is that the phase noise should have a significant noise power at frequencies up to ten times the clock frequency.

Figure 7:
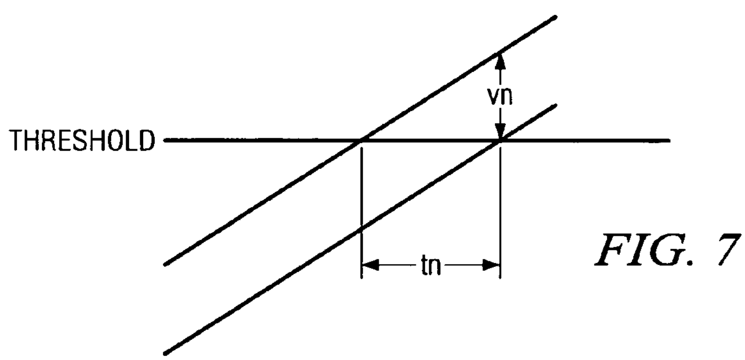
FIG. 7 illustrates the creation of jitter in the noise buffer.
Figure 8:
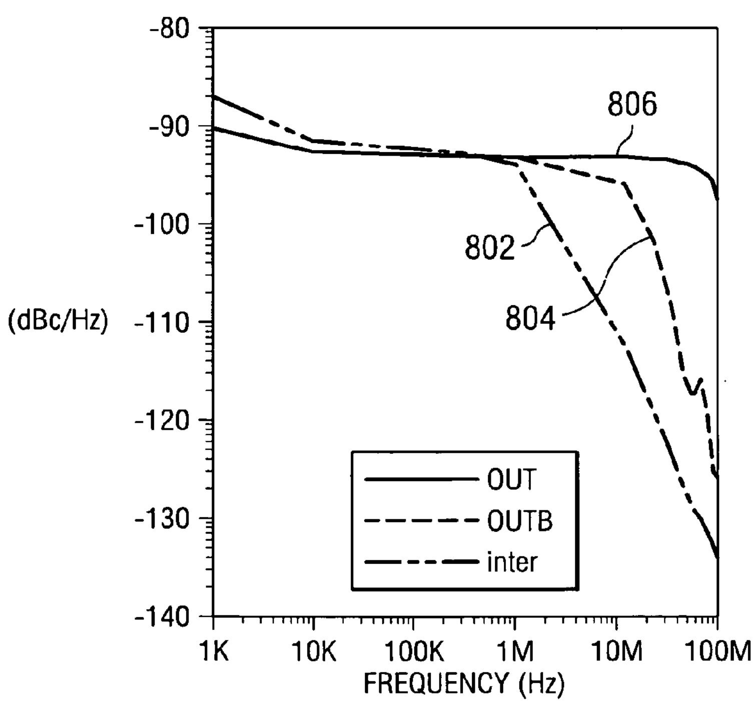
FIG. 8 shows a simulation of the phase noise.

In the noise buffer shown in FIG. 5, jitter is created by adding voltage noise to a low-sloped voltage wave form, as illustrated in FIG. 7. Since TN=VN/slope, the lower the slope, the higher the jitter. The low slope waveform is obtained from node E (FIG. 5), which is the output of the differential-to-single ended converter. This high impedance node limits the bandwidth of the noise. In order to obtain the higher frequency noise components which are important, as described above in connection with FIG. 6, the waveform is passed into a succession of inverters which owing to their non-linearity and the squared and cubed terms which represent the noise, smear the noise into higher frequencies. The phase noise simulation results from SPECTRE are shown in FIG. 8. The band limited nature of the noise at the output of the first stage can clearly be seen. The smearing of the noise into higher frequencies by passing it through the inverters is also seen. The RMS jitter is 30 nsec.

Figure 9A:
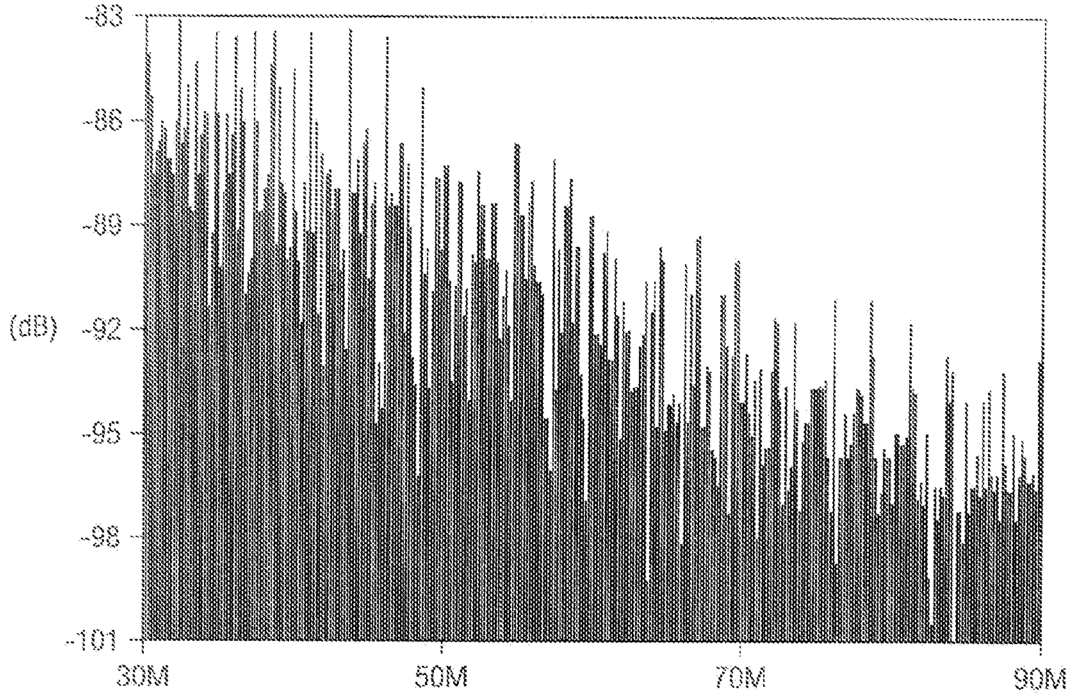
FIG. 9 shows a transient simulation of dominant noise sources.
Figure 9B:
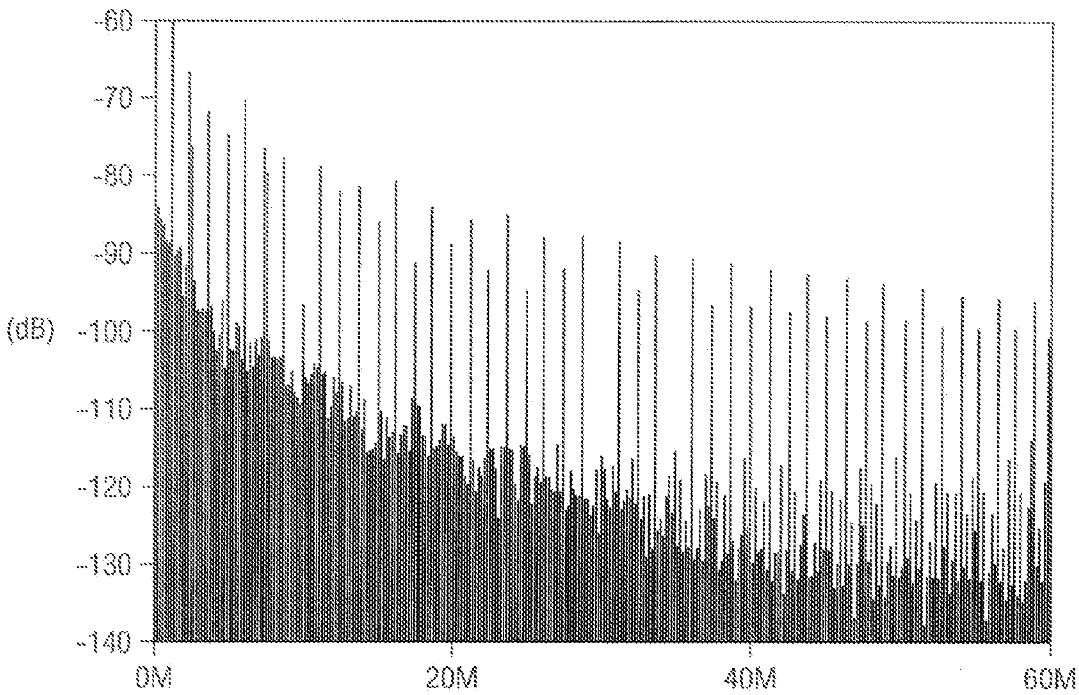

A transient simulation was done utilizing dominant sources modeled with piecewise-linear sources using noise values defined in a file that contains oversampled (2.2 GHz) random numbers with a pre-determined variance in order to confirm the results of the SPECTRE simulation. This file was generated using MATLAB. In this case, the only dominant sources are the bottom tail current sink and the mirror from which the tail is generated. The results of the simulation are shown in FIG. 9, where FIG. 9B shows the phase noise spectrum at the input of the file inverter and FIG. 9A shows the phase noise spectrum at the output of that inverter. As can be seen there is a close match between the simulations.

Figure 10:
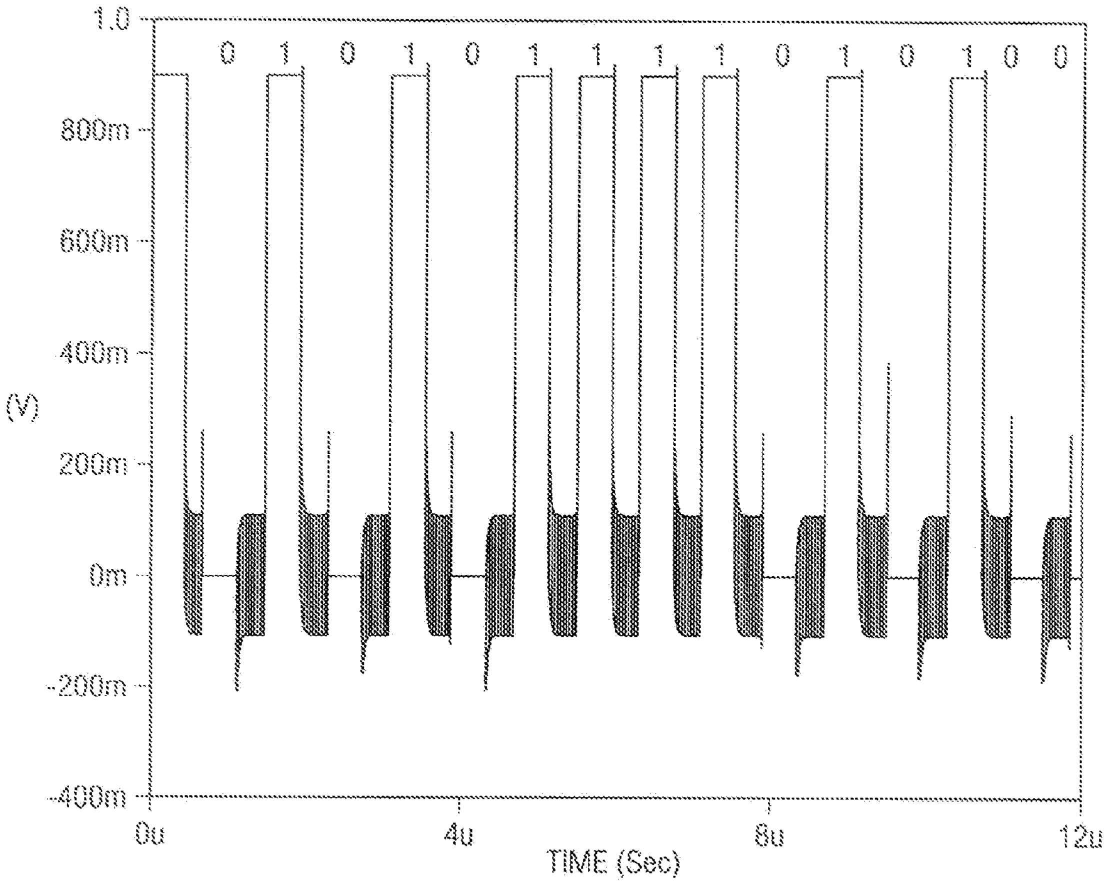
FIG. 10 shows the output waveform of the circuit.

A representative wave form at the output of the random noise generator is shown in FIG. 10, with the digital bit stream that it represents being shown at the top of the figure.

While the invention has been shown and described with reference to preferred embodiments thereof, it is well understood by those skilled in the art that various changes and modifications can be made in the invention without departing from the spirit and scope of the invention as defined by the appended claims.

What is claimed is:

1. A passive Radio Frequency Identification (RFID) circuit comprising the following circuits powered exclusively from an interrogating radio frequency (RF) signal:

a radio receiver for wirelessly receiving the RF signal from an antenna;

a power circuit coupled to said RF signal for powering the passive RFID circuit exclusively from the RF signal;

a system clock generating a clock signal having a frequency that is less than frequency of the RF signal;

a noise buffer coupled to the system clock for adding jitter to the clock signal to generate a jittered clock signal;

a sample-and-hold circuit coupled to the receiver and the noise buffer for sampling the wirelessly received interrogating RF signal with the jittered clock to generate a random number.

2. The RFID circuit of claim 1 wherein the RF frequency is 1000 times the clock frequency.

3. The RFID circuit of claim 1 wherein Root Mean Square (RMS) jitter is a plurality of a period of the RF signal.

4. The RFID circuit of claim 1 wherein RMS jitter is at least six (6) times a period of the RF signals.

5. The RFID circuit of claim 1 further comprising a resampling circuit for synchronizing an output of the sample-and-hold circuit with a system clock.

6. The RFID circuit of claim 1 wherein the sample-and-hold circuit comprises a differential latch circuit.

7. The RFID circuit of claim 5 wherein the sample-and-hold circuit comprises a differential latch circuit.

8. The RFID circuit of claim 1 wherein jitter is generated in the noise buffer by adding voltage noise to a low-sloped waveform.

9. The RFID circuit of claim 5 wherein jitter is generated in the noise buffer by adding voltage noise to a low-sloped waveform.

10. The RFID circuit of claim 8 wherein the jittered signal is passed through a plurality of inverters to smear the noise into higher frequencies.

11. The RFID circuit of claim 9 wherein the jittered signal is passed through a plurality of inverters to smear the noise into higher frequencies.

* * * * *